United States Patent [19]
Akita

[11] Patent Number: 5,886,942
[45] Date of Patent: Mar. 23, 1999

[54] WORD LINE DRIVER AND SEMICONDUCTOR DEVICE

[75] Inventor: Hironobu Akita, Yokohama, Japan

[73] Assignee: Kabushiki Kaisha Toshiba, Kawasaki, Japan

[21] Appl. No.: 964,398

[22] Filed: Nov. 6, 1997

[30] Foreign Application Priority Data

Nov. 6, 1996 [JP] Japan .................................... 8-294031

[51] Int. Cl.[6] ...................................................... G11C 8/00
[52] U.S. Cl. .............................. 365/230.06; 365/230.08
[58] Field of Search ........................ 365/230.06, 230.08, 365/189.05

[56] References Cited

U.S. PATENT DOCUMENTS

| | | | |
|---|---|---|---|
| 5,513,142 | 4/1996 | Arimoto et al. | 365/230.06 |
| 5,602,796 | 2/1997 | Sugio | 365/230.06 |
| 5,617,369 | 4/1997 | Tomishima et al. | 365/230.06 |
| 5,644,548 | 7/1997 | Kitsukawa et al. | 365/230.06 |

OTHER PUBLICATIONS

Yamagata et al., "Circuit Design Techniques for Low–Votage Operating and/or Giga–Scale DRAMs" ISSCC Dig. of Tech. Papers, pp. 248–249, 1995.

*Primary Examiner*—David Nelms
*Assistant Examiner*—M. Tran
*Attorney, Agent, or Firm*—Banner & Witcoff, Ltd.

[57] ABSTRACT

A word line driver includes a CMOS inverter constituted by a P channel MOS transistor in which a row decode signal having the amplitude of an internal logic power supply voltage is supplied to a gate, one end of the source-drain current path is connected to a node to which a power supply voltage (VWLh) is applied, and the other end of the source-drain current path is connected to a word line, and an N channel MOS transistor in which the input signal is supplied to a gate, one end of the source-drain current path is connected to a node to which a power supply voltage (VWLl) having a negative value is applied, and the other end of the source-drain current path is connected to the word line. The circuit threshold voltage of the CMOS inverter is set to be larger than the circuit threshold voltages of other CMOS inverters which operate using internal logic power supply voltages.

31 Claims, 12 Drawing Sheets

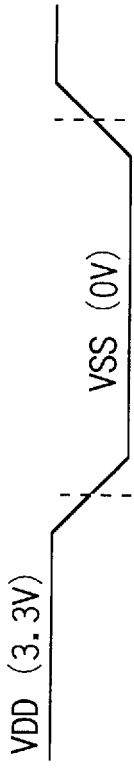
FIG. 9A  DECODER OUTPUT E15
(GENERATOR INPUT E15A)
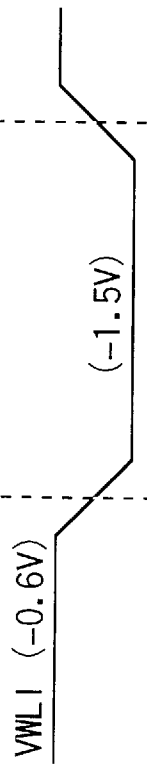
FIG. 9B  OUTPUT E45 OF GENERATOR 45
(POTENTIAL OF Pwell OF 22)
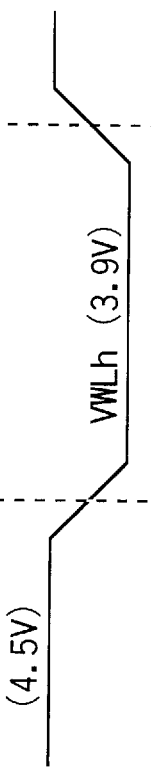
FIG. 9C  OUTPUT E46 OF GENERATOR 46
(POTENTIAL OF Nwell OF 21)
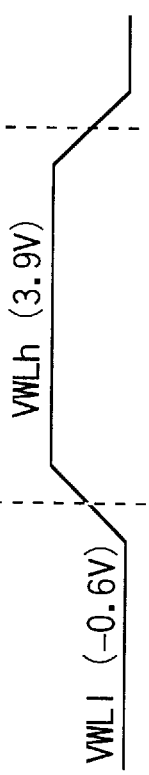
FIG. 9D  OUTPUT E16 OF
WL DRIVER 16
* REFERENCE OF POTENTIAL = VSS (0V)

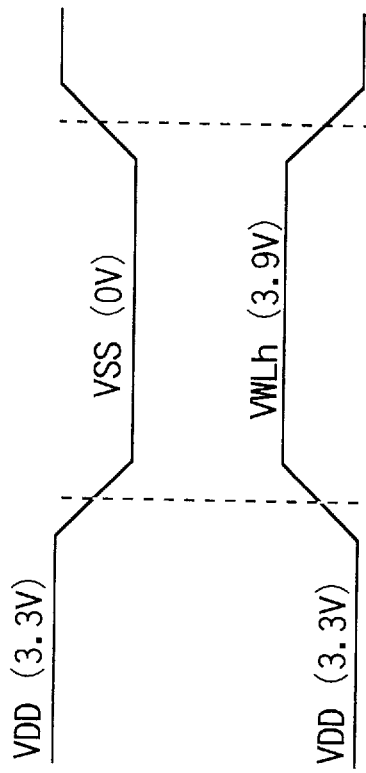
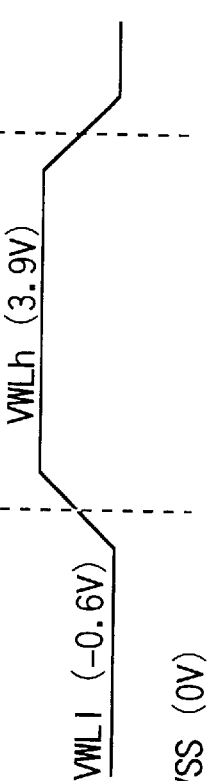
FIG. 10A  DECODER OUTPUT E15
FIG. 10B  SOURCE POTENTIAL OF 51 (POTENTIAL SELECTED BY 56)
FIG. 10C  SOURCE POTENTIAL OF 53 (POTENTIAL SELECTED BY 59)
FIG. 10D  OUTPUT E16 OF WL DRIVER 16
\* REFERENCE OF POTENTIAL = VSS (0V)

WORD LINE DRIVER AND SEMICONDUCTOR DEVICE

BACKGROUND OF THE INVENTION

The present invention relates to a dynamic semiconductor memory device and, more particularly, to an improvement of a word line driver for driving a word line.

In the memory cell of a dynamic semiconductor memory device (DRAM), a bit line voltage is written in a memory capacitor through a transfer gate using an N channel MOS transistor. In the write access, to prevent the high-level voltage on the bit line from lowering by an amount corresponding to the threshold voltage of the transfer gate before being written in the memory capacitor, a signal voltage for driving the transfer gate is boosted to a level higher than the power supply voltage. The gate electrode of the transfer gate is connected to a word line. The high-level voltage on the word line is set at step-up voltage VPP having a value corresponding to (high-level voltage on bit line)+(threshold voltage of N channel MOS transistor)+(margin for process variations) (this scheme will be referred to as a word line boosting scheme).

In a word line driver which applies step-up voltage VPP to one word line selected from a plurality of word lines by a row decoder and applies a low-level voltage to nonselected word lines, step-up voltage VPP is supplied as a power supply voltage and is also supplied as a high-level input signal.

In the word line driver of a DRAM according to the above-mentioned word line boosting scheme, each gate of the P channel and first N channel MOS transistors connected to the word line receives from the row decoder a decode output signal which becomes circuit ground voltage VSS when the word line is to be selected. The source of the P channel MOS transistor receives word line drive signal WDLV which becomes step-up voltage VPP when the word line is to be selected. The gate of the second N channel MOS transistor receives signal /WDLV of regular power supply voltage VDD. The logical level of signal /WDLV is inverted from that of word line drive signal WDLV, and the voltage of the high level of signal /WDLV is smaller than step-up voltage VPP.

In the word line driver having such a circuit arrangement, when the decode output signal from the row decoder is circuit ground voltage VSS in the selected state wherein signal WDLV is step-up voltage VPP, the P channel MOS transistor is turned on, and step-up voltage VPP is output to word line WL. When the decode output signal from the row decoder is VPP in the selected state, the N channel MOS transistor is turned on, and circuit ground voltage VSS is output to word line WL. When the word line driver is in a nonselected state, signal /WDLV becomes VDD. Then, the second N channel MOS transistor is turned on, so that word line WL is held at circuit ground voltage VSS.

As the decoder for decoding an address signal and generating a signal to be supplied to the word line driver on the basis of the decode output signal, there is a level converter based on a dynamic circuit scheme wherein a predetermined circuit node is precharged with step-up voltage VPP and determining the input level of the input signal having an internal circuit voltage level (VDD or VSS).

However, the above-mentioned prior art has the following problems.

(1) The voltage to be applied to the word line is VPP. For this reason, when the stored charges in the memory capacitor are at level "0", and the word line is set at level "1", the step-up voltage is applied to the gate oxide film of the transfer gate, so the reliability of the oxide film is degraded as compared to other logic transistors.

(2) To obtain almost the same reliability as that of other logic transistors for the gate oxide film of the transfer gate, the film must be made thicker to equalize the electric field applied to the gate oxide film, resulting in a decrease in conductance of the transfer gate. This decrease in conductance lowers the speed of the entire DRAM.

(3) It takes a longer time to charge a load capacity such as the capacitance of a word line with the step-up voltage than to charge using the internal power supply voltage. The increase in charge time also lowers the speed of the entire DRAM.

As a technique of avoiding these problems, a negative voltage driven word line scheme disclosed in the below literature is known:

1995 IEEE INTERNATIONAL SOLID-STATE CIRCUITS CONFERENCE; ISSCC95/SESSION 14/DRAM/PAPER FA 14.3, pp 248–249, "Circuit Design Techniques for Low-Voltage Operating and/or Giga-Scale DRAMs", T. Yamada et al.

In this technique, while holding the amplitude of the word line, the voltage level on the low level side is set at a negative potential, i.e., the voltage level on the low level side of the amplitude of the word line signal is lowered, and simultaneously, the threshold voltage of the transfer gate is lowered.

FIG. 11 exemplifies the relationship in voltages between the above word line boosting scheme and the negative voltage driven word line scheme.

The left side illustration in FIG. 11 shows the former word line boosting scheme. The high-level voltage on the word line is set at step-up voltage VPP (e.g., 4.5V), and the low-level voltage is set at circuit ground voltage VSS (0V). High-level voltage VDD of the internal circuit is set at, e.g., 3.3V. Vth in FIG. 11 represents the threshold voltage (e.g., 0.9V) of the transfer gate in the memory cell.

The right side illustration in FIG. 11 shows the latter negative voltage driven word line scheme. Low-level voltage VWLl on the word line is set to be lower (e.g., −0.6V) than circuit ground voltage VSS. High-level voltage VWLh on the word line is set at 3.9V which is lower than step-up voltage VPP by 0.6V. In this scheme, threshold voltage Vth* of the transfer gate in the memory cell is set to be lower than threshold voltage Vth of the word line boosting scheme by (VPP−VWLh).

According to the negative voltage driven word line scheme, when the signal voltage on the word line is at high level, the write voltage for the memory cell capacitor is VWLh−Vth*=VPP−Vth, i.e., equal to the write voltage in the word line boosting scheme. When the signal voltage on the word line is at low level, the charge hold characteristic of the memory cell capacitor is represented by Vth*−VWLl=Vth−VSS, i.e., the same characteristic as that in the word line boosting scheme.

That is, in the negative voltage driven word line scheme, the high-level signal voltage on the word line can be lowered without degrading the write characteristic and charge hold characteristic, so the reliability of the gate oxide film of the transfer gate can be prevented from lowering.

FIG. 4 on page 249 of said literature "ISSCC95/SESSION 14/DRAM/PAPER FA 14.3" exemplifies a prior art word line driver circuit used for a DRAM of the negative voltage driven word line scheme. This circuit comprises a first MOS transistor pair having low threshold voltages, a P channel MOS transistor pair of the Vpp (2.2V) side, and a second N channel MOS transistor pair of the Vbb (−0.5V) side.

In this circuit, the one gate of the first MOS transistor pair is connected to a circuit with a predetermined potential Vcc (1.2V), and the other gate thereof is circuit-grounded. The respective one electrodes (sources or drains) of the MOS transistor pairs of the gate-Vcc side and of the gate-grounded side receive the row decode output.

The Vpp-side MOS transistor pair and the Vbb-side MOS transistor pair have cross-coupled circuit connections. The one drain of the Vpp-side MOS transistor pair is connected to the other electrode (drain or source) of the gate-Vcc side MOS transistor pair, and the one drain of the Vbb-side MOS transistor pair is connected to the other electrode (drain or source) of the gate-grounded side MOS transistor pair. The respective other drains of the Vpp-side MOS transistor pair and the Vbb-side MOS transistor pair are connected to each other at a connection node, and a word line drive signal corresponding to the row decode output is supplied from the connection node to word line WL.

In the word line driver having this arrangement, the output signal from the row decoder is level-converted into a signal having an amplitude between Vpp and Vbb and supplied to word line WL.

However, the word line driver of the above ISSCC95 requires six MOS transistors, i.e., the six MOS transistors must be arranged in units of word lines. This makes a pattern layout of the word line driver according to the decoder pitch difficult. Thus, an increase in occupied area of the driver lowers the cell occupation ratio, resulting in an increase in manufacturing cost.

In addition, since a relatively large voltage of Vpp−Vbb is applied to the gate oxide film of the Vpp-side and Vbb-side MOS transistor pairs in the word line driver, these MOS transistor pairs also have a problem of poor reliability with respect to the withstanding voltage of their gate.

BRIEF SUMMARY OF THE INVENTION

The present invention has been made in consideration of the above situation, and has its first object to provide a word line driver which allows reduction in the number of required elements as compared to the prior art, which can facilitate layout according to the decoder pitch, and which can reduce the manufacturing cost.

The second object of the invention is to provide a semiconductor device employing the above word line driver.

According to the present invention, there is provided a word line driver comprising a CMOS inverter constituted by a first P channel MOS transistor in which an input signal having an amplitude between a first voltage and a second voltage lower than the first voltage is supplied to a gate, one end of a source-drain current path is connected to a node to which a third voltage higher than the first voltage is applied, and the other end of the source-drain current path is connected to a word line, and a second N channel MOS transistor in which the input signal is supplied to a gate, one end of a source-drain current path is connected to a node to which a fourth voltage which is lower than the second voltage and has a negative value is applied, and the other end of the source-drain current path is connected to the word line.

The circuit threshold voltage of the CMOS inverter is set to be higher than circuit threshold voltages of other CMOS inverters which operate with the first and second voltages as power supply voltages (in the example of FIG. 5, this corresponds to a case where the absolute values of VthN and VthP are set to be large).

According to a semiconductor device utilizing a word line driver of the present invention, there is provided a semiconductor substrate of a first conductivity type, first and second well regions of a second conductivity type and a third well region of the first conductivity type, the first, second, and third well regions being separately formed in the semiconductor substrate, an isolation region of the second conductivity type formed in the semiconductor substrate, a fourth well region of the first conductivity type formed in the isolation region, a decoder circuit for decoding an address signal and outputting a signal having an amplitude between a first voltage and a second voltage lower than the first voltage, a first P channel MOS transistor formed in the first well region, a second N channel MOS transistor formed in the third region and constituting a first CMOS inverter together with the first MOS transistor, a third P channel MOS transistor formed in the second well region, in which the output signal from the decoder circuit is supplied to a gate, one end of a source-drain current path is connected to a node to which a third voltage higher than the first voltage is applied, and the other end of the source-drain current path is connected to a word line, a fourth N channel MOS transistor formed in the fourth well region and constituting a second CMOS transistor together with the third MOS transistor, in which the input signal is supplied to a gate, one end of a source-drain current path is connected to a node to which a fourth voltage which is lower than the second voltage and has a negative value is applied, and the other end of the source-drain current path is connected to the word line, a first bias voltage generation circuit for generating a first bias voltage and applying the first bias voltage to the second well region, and a second bias voltage generation circuit for generating a second bias voltage and applying the second bias voltage to the fourth well region.

The first and second bias voltage generation circuits generate the first and second bias voltages, respectively, such that a circuit threshold voltage of the second CMOS inverter becomes higher than that of the first CMOS inverter.

According to another word line driver of the present invention, there is provided a first power supply line to which a first voltage is applied, a second power supply line to which a second voltage higher than the first voltage is applied, a third power supply line to which a third voltage lower than the first voltage is applied, a fourth power supply line to which a fourth voltage which is lower than the third voltage and has a negative value is applied, a first P channel MOS transistor in which an input signal having an amplitude between the first voltage and the third voltage is supplied to a gate, a drain is connected to a word line, and a backgate is connected to the second power supply line, a second N channel MOS transistor in which the input signal is supplied to a gate, a drain is connected to the word line, and a backgate is connected to the fourth power supply line, a first switching circuit for performing control to connect the source of the first MOS transistor to one of the first and second power supply lines, and a second switching circuit for performing control to connect the source of the second MOS transistor to one of the third and fourth power supply lines.

According to the present invention, there is provided a semiconductor memory device comprising a decoder circuit for decoding an address signal and outputting a signal having an amplitude between a first voltage and a second voltage lower than the first voltage, a word line driver having a CMOS inverter constituted by a first P channel MOS transistor in which the output signal from the decoder circuit is supplied to a gate, one end of a source-drain current path is connected to a node to which a third voltage higher than the first voltage is applied, and the other end of the source-drain current path is connected to a word line, and a second N channel MOS transistor in which the output signal from the decoder circuit is supplied to a gate, one end of a source-drain current path is connected to a node to which a fourth voltage which is lower than the second voltage and has a negative value is applied, and the other end of the source-drain current path is connected to the word line, and a memory cell constituted by a transfer gate and a memory capacitor, the transfer gate being ON/OFF-controlled on the basis of a signal on the word line.

The circuit threshold voltage of the CMOS inverter of the word line driver is set to be higher than circuit threshold voltages of other CMOS inverters which operate with the first and second voltages as power supply voltages.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 9A–9D are timing charts for explaining how bias voltage generators 45 and 46 in the embodiment of FIG. 7 generate respective bias voltages;

FIGS. 10A–10D are timing charts for explaining how switches 56 and 59 in the embodiment of FIG. 8 perform their switching operations;

DETAILED DESCRIPTION OF THE INVENTION

The embodiments of the present invention will be described below with reference to the accompanying drawing.

Figure 1:
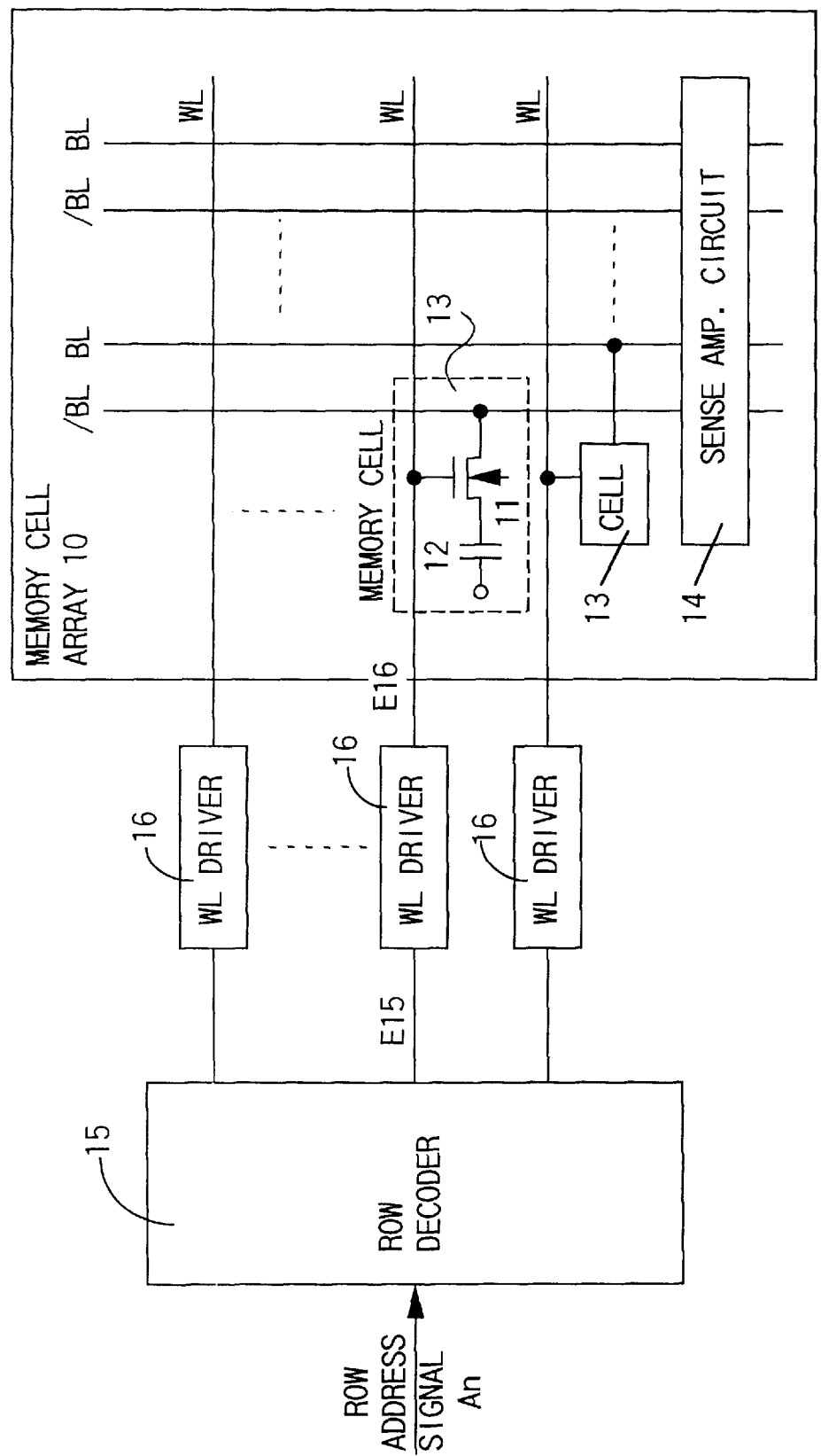
FIG. 1 shows a dynamic semiconductor memory device (DRAM) including a word line driver according to the first embodiment of the present invention.

FIG. 1 shows the arrangement of part of a dynamic semiconductor memory device (DRAM) containing a word line driver according to the first embodiment of the present invention.

A number of memory cells 13 (only two memory cells are illustrated in FIG. 1) each comprising transfer gate 11 of an N channel MOS transistor and memory capacitor 12 are arranged in cell array 10.

The drain of transfer gate 11 in memory cell 13 is connected to one bit line (here /BL) of one of a plurality of bit line pairs BL and /BL (only two pairs are illustrated herein), and the source thereof is connected to one terminal of memory capacitor 12. The other terminal of memory capacitor 12 is connected to a predetermined voltage node, e.g., the circuit ground voltage node (illustrated as a small circle). The gate electrode of transfer gate 11 is connected to one of a plurality of word lines WL.

Sense amplifier 14, which amplifies a read signal from each memory cell 13 to sense the stored data, is connected to each bit line pair (BL, /BL). Here, the read signal is represented by the bit line potential corresponding to the charge stored in memory capacitor 12.

Row decoder 15 selects one of the plurality of word lines WL in accordance with the input row address signal (An) and drives the selected word line. A plurality of driver circuits (word line drivers) 16 are arranged between each of the plurality of decode signal output terminals of row decoder 15 and a corresponding one of the plurality of word lines WL.

Figure 2:
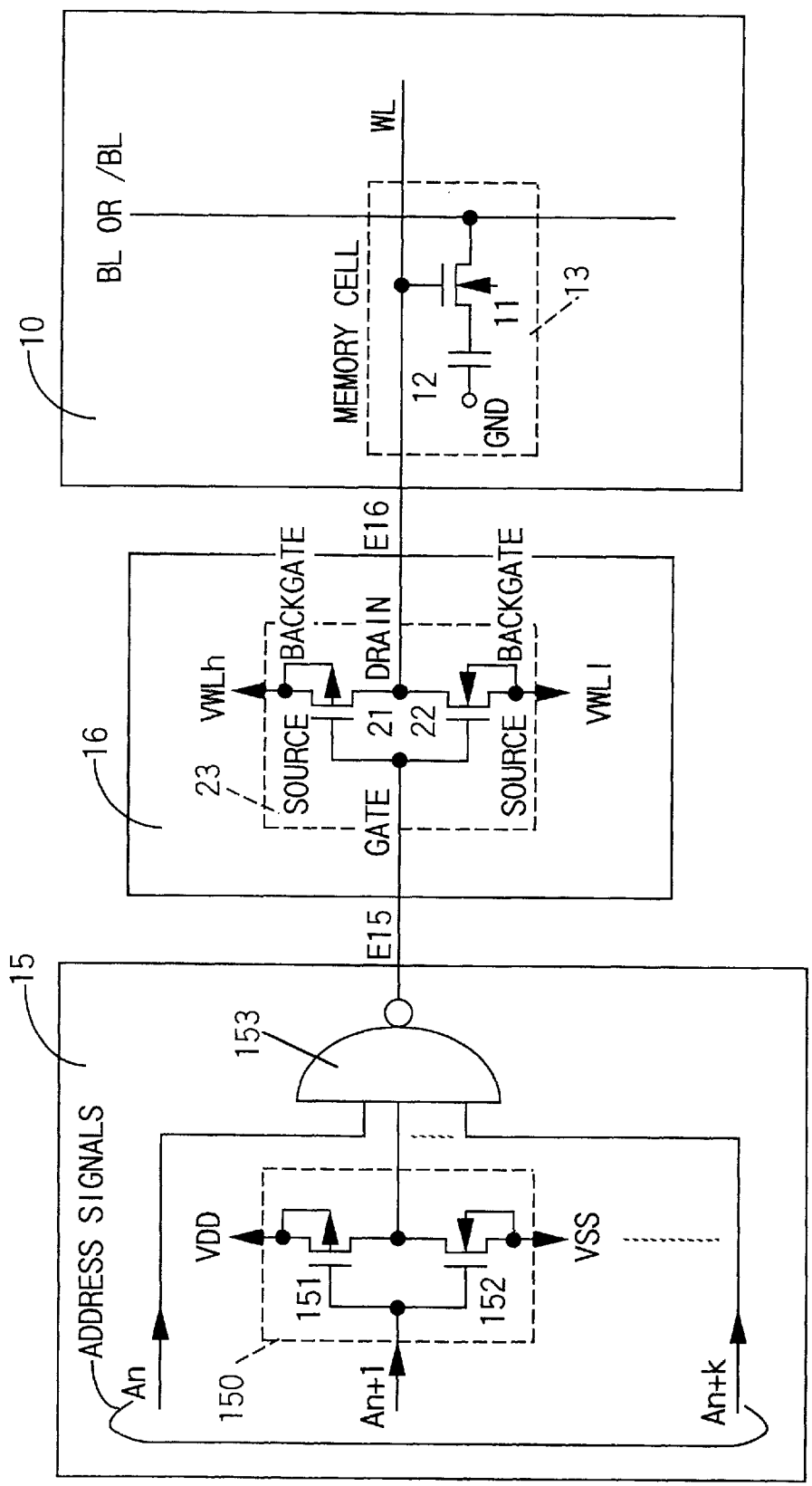
FIG. 2 shows details of the circuit arrangement of the word line driver shown in FIG. 1 together with a memory cell.

FIG. 2 shows details of the circuit arrangement of word line driver 16 in FIG. 1 together with memory cell 13.

Word line driver 16 comprises CMOS inverter 23 constituted by P channel MOS transistor 21 whose source and backgate are connected to a node of power supply voltage VWLh and whose drain is connected to corresponding word line WL, and N channel MOS transistor 22 whose source and backgate are connected to another node of power supply voltage VWLl and whose drain is connected to corresponding word line WL. The gates of these MOS transistors 21 and 22 are commonly connected. Row decode signal E15 output from a corresponding output terminal of row decoder 15 is input to the commonly-connected gates.

The high-level voltage of row decode signal E15 input to the gates of MOS transistors 21 and 22 is set at power supply voltage VDD (e.g., 3.3V) of the internal logic circuit, and the low-level voltage of row decode signal E15 is set at circuit ground voltage VSS (e.g., 0V) of the internal logic circuit.

Figure 11:
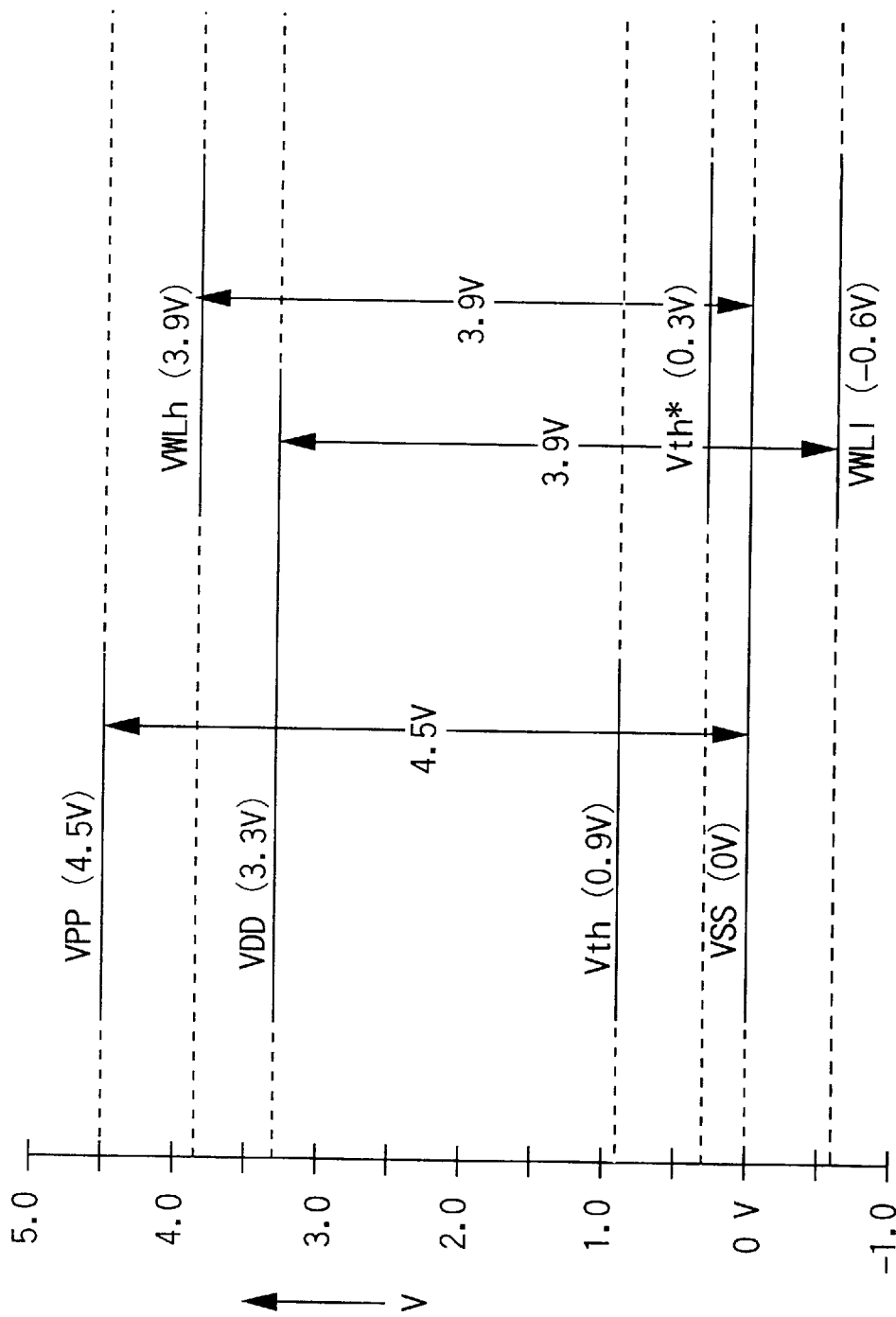
FIG. 11 shows the relationship in voltage between a word line boosting scheme and a negative voltage driven word line scheme.

Power supply voltage VWLh is set to be higher than VDD but lower than step-up voltage VPP, e.g., 3.9V, as shown in FIG. 11. Power supply voltage VWLl is set to have a negative value smaller than the value of VSS, e.g., −0.6V.

The threshold voltage of the MOS transistor constituting transfer gate 11 in memory cell 13 is set to have a small value, as in the negative voltage driven word line scheme.

The circuit threshold voltage of CMOS inverter 23 in driver 16 is set to be higher than that of another CMOS inverter other than CMOS inverter 23. This another CMOS inverter operates with voltages VDD and VSS as power supply voltages.

As an example of the above-mentioned another CMOS inverter, FIG. 2 shows inverter 150 in row decoder 15 for buffering the address signal.

More specifically, a specific bit of the address signal (An+1) selected from a plural bits (k bits) of address signals An to An+k is input to each gate of P channel MOS transistor 151 and N channel MOS transistor 152. The source and backgate of P channel MOS transistor 151 are connected to the power line of VDD, and the source and backgate of N channel MOS transistor 152 are connected to the power line of VSS. An inverted address signal obtained by buffering the address signal (An+1) is output from the drains of MOS transistors 151 and 152. Including this inverted address signal, respective bit signals of address signals An to An+k are input to NAND gate 153. Row decode signal E15 is output from NAND gate 153.

The above P and N channel MOS transistors 151 and 152 constitute said another CMOS inverter (which may have a function of a signal buffer).

In the DRAM having the above arrangement, when row address signals (An to An+k) are input to row decoder 15, one of the plurality of word lines WL is selected. A signal (E15="0") having the value of VSS is output only from the decode signal output terminal of row decoder 15 corresponding to the selected word line. Other signals (E15="1") having the value of VDD are output from the remaining decode signal output terminals respectively corresponding to the nonselected word lines.

The above signal (E15="0") of row decoder 15 corresponding to the selected word line WL is level-inverted via word line driver 16, and changed to word line signal E16 having a "1" level only at the selected word line WL.

For instance, assume that the row address signals (An to An+k) input to row decoder 15 include address bit An+1 with the "0" level and other address bits (An, An+2 to An+k) all with the "1" levels. In this case, row decode signal E15 becomes "0" level. This E15="0" is level-inverted via CMOS buffer (CMOS inverter) 23 in word line driver 16, and changed to word line drive signal E16 with "1" level. By this E16="1", specific memory cell 13 connected to the corresponding word line WL (with E16="1") is selected.

Assume that a decode signal (E15="1") having the value of VDD is input to CMOS inverter 23 in word line driver 16 shown in FIG. 2. Since the input signal is at high level ("1"), N channel MOS transistor 22 in CMOS inverter 23 is turned on, and low-level voltage VWLl (E16="0") is output from word line driver 16 to the corresponding word line WL.

At this time, the voltage applied across the gate and source of P channel MOS transistor 21 in CMOS inverter 23 is (VWLh−VDD)=3.9V−3.3V=0.6V. The voltage applied across the gate and source of N channel MOS transistor 22 is (VDD−VWLl)=3.3V−(−0.6V)=3.9V. Either voltage can be made sufficiently lower than that (4.5V) in the negative voltage driven word line scheme using step-up voltage VPP.

Assume that a decode signal (E15="0") having the value of VSS is input to CMOS inverter 23 in word line driver 16. Since the input signal is at low level ("0"), P channel MOS transistor 21 is turned on, and high-level voltage VWLh (E16="1") is output from word line driver 16 to the corresponding word line WL.

At this time, the voltage applied across the gate and source of P channel MOS transistor 21 in CMOS inverter 23 is (VWLh−VSS)=3.9V−0V=3.9V. The voltage applied across the gate and source of N channel MOS transistor 22 is (VSS−VWLl)=0V−(−0.6V)=0.6V. Either voltage can be made sufficiently lower than that (4.5V) in the negative voltage driven word line scheme using step-up voltage VPP. As a result, MOS transistors 21 and 22 constituting driver 16 can ensure sufficient reliability without increasing the thickness of the gate oxide film.

Figure 3:
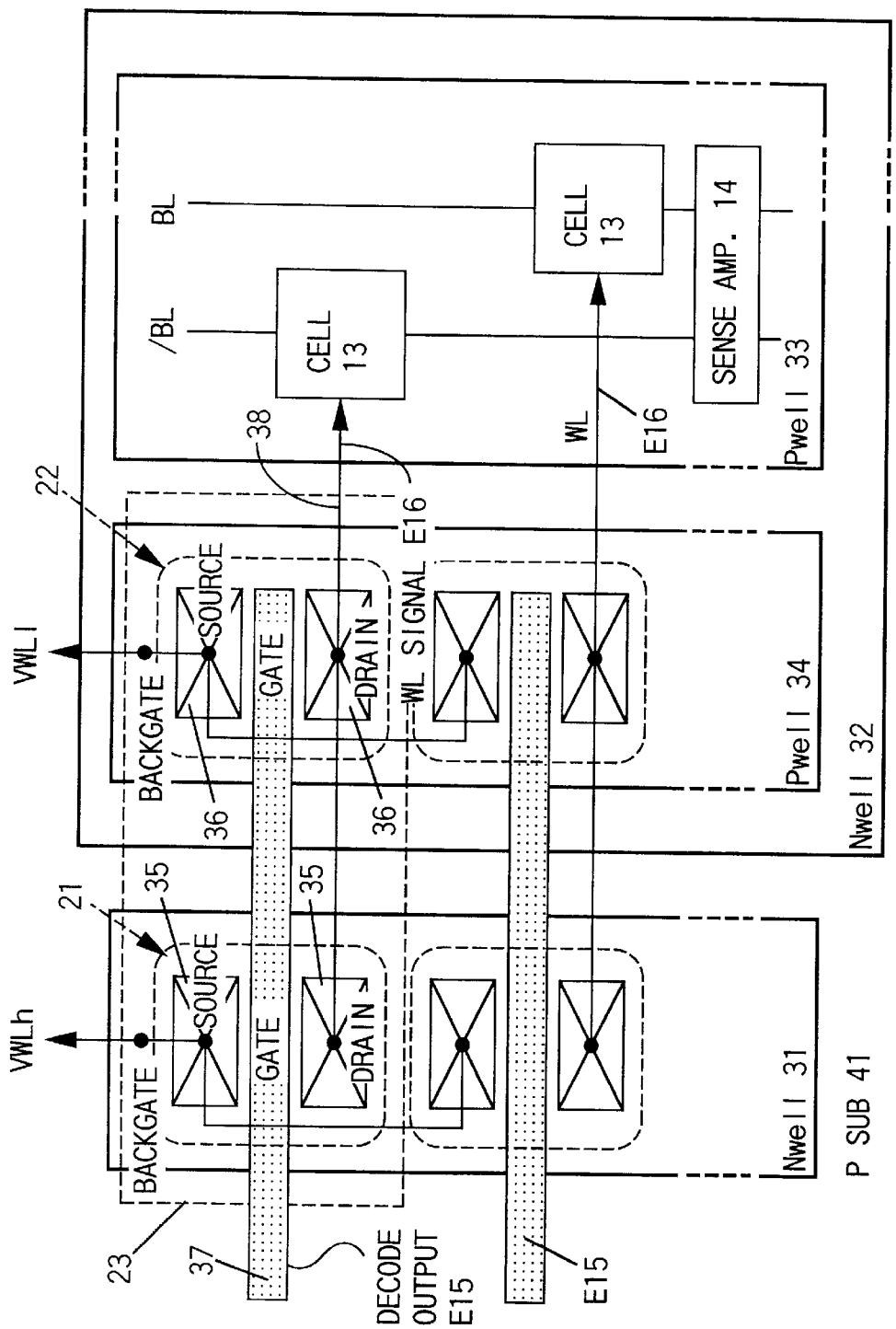
FIG. 3 is a pattern diagram showing the arrangement of the word line driver on a semiconductor chip and a cell array of the first embodiment.

FIG. 3 is a pattern diagram showing the arrangement state of word line driver 16 and cell array 10 in the first embodiment.

Referring to FIG. 3, reference numerals 31 and 32 denote N type well regions (N-wells); and 33 and 34, P type well regions (P-wells) formed in N type well region 32. P type diffusion layers 35 constituting the source and drain of P channel MOS transistor 21 shown in FIG. 2 are formed in N type well region 31, and N type diffusion layers 36 constituting the source and drain of N channel MOS transistor 22 shown in FIG. 2 are formed in P type well region 34.

N type diffusion layers (not shown) constituting the source and drain of N channel MOS transistor 11 for the transfer gate in memory cell 10 are formed in P type well region 33.

Reference numeral 37 denotes a gate interconnection to which the output from row decoder 15 is supplied; and 38, a word line (WL) consisting of polysilicon.

In this example, since the backgate of P channel MOS transistor 21 is connected to the source of MOS transistor 21, voltage VWLh is applied to N type well region 31 shown in FIG. 3 as a substrate bias voltage. Since the backgate of N channel MOS transistor 22 is also connected to the source of MOS transistor 22, voltage VWLl is applied to P type well region 34 shown in FIG. 3 as a substrate bias voltage.

As described above, in word line driver 16, power supply voltage VWLh (e.g., 3.9V) is set to be higher than VDD (e.g., 3.3V) and lower than step-up voltage VPP (e.g., 4.5V). Power supply voltage VWLl is set to have a negative value (e.g., −0.6V) smaller than the value of VSS (e.g., 0V).

At this time, the voltage applied across the gate and source of P channel MOS transistor 21 is (VWLh−VDD). The voltage applied across the gate and source of N channel MOS transistor 22 is (VDD−VWLl). Either voltage can be made sufficiently lower than that in the negative voltage driven word line scheme using step-up voltage VPP. Thus, word line driver 16 can be constituted by only two MOS transistors 21 and 22 each of whose gate oxide film is free from an excessive high voltage.

Word line driver 16 can be constituted by only two MOS transistors, so that the layout according to the decoder pitch is facilitated. In addition, since the occupied area of word line driver 16 need not be increased, the occupation ratio of memory cell 13 within the limited area of an IC pellet can be raised, and the manufacturing cost can be reduced.

Figure 4:
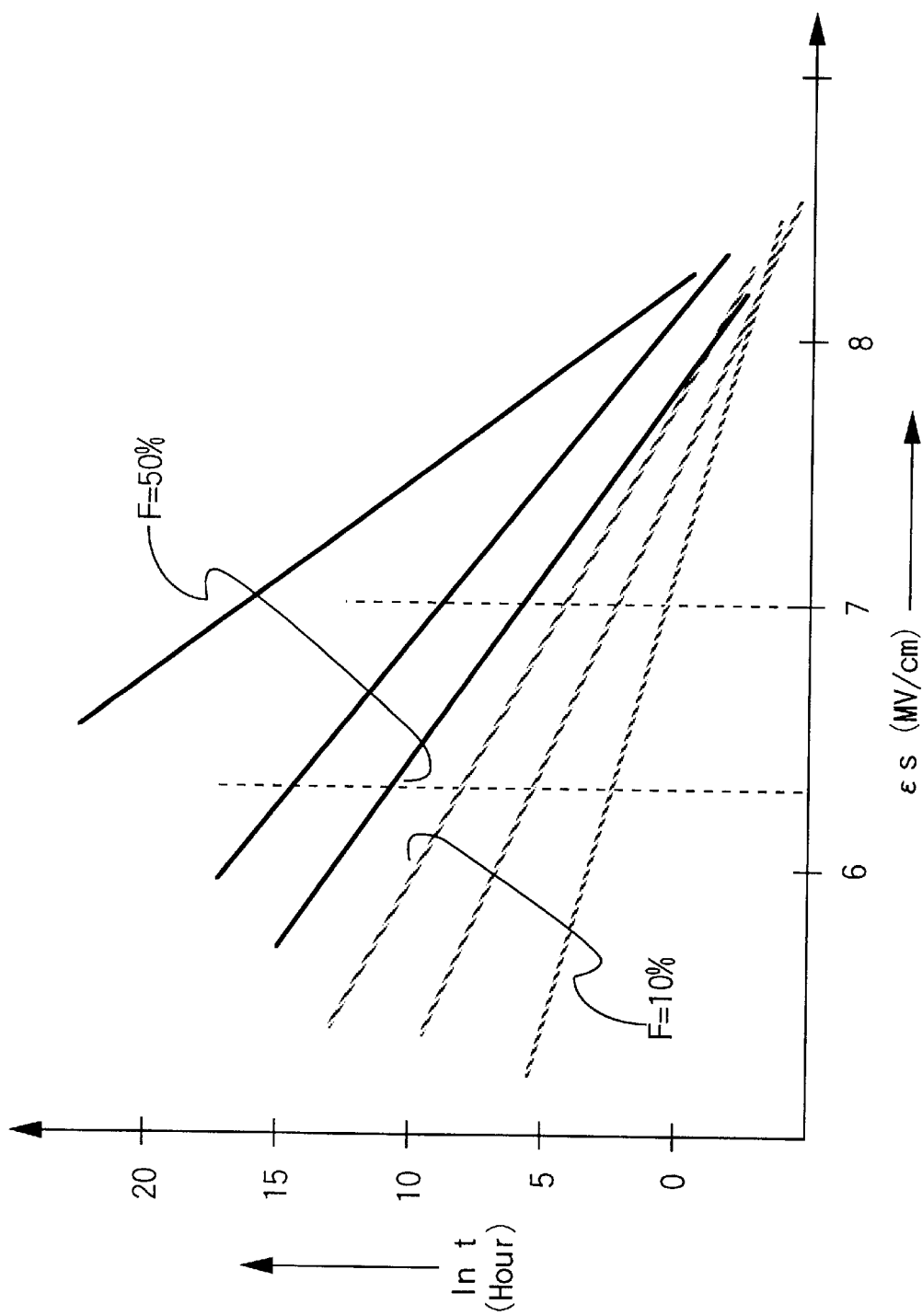
FIG. 4 shows examples of the relationship between the stress field $\epsilon$ s (MV/cm) applied to the gate oxide film of a MOS transistor and the withstand time lnt (Hour) thereof.

FIG. 4 shows the relationship between stress field ε s (MV/cm) applied to the gate oxide film of a MOS transistor and time lnt (Hour), i.e., stress field ε s vs. withstand time t until accumulated fraction defective F (%) reaches a predetermined value (in this case, 10% and 50%). (Here, "ln" of the above time lnt assigned to the vertical axis of FIG. 4 means a natural log.)

As is apparent from FIG. 4, the withstand time t exponentially changes. When stress field ε s decreases by about 10% (for example, ε s is changed from 7 MV/cm to 6.3 MV/cm), time t prominently increases to 100 to 10,000 times.

FIG. 4 suggests that when the electric field applied to the gate oxide films of two MOS transistors 21 and 22 constituting word line driver 16 is lowered, sufficient reliability of the withstanding voltage can be ensured without thickening the gate oxide film. More specifically, the gate oxide film can be made thinner to some extent (about 10 nm of the thickness of the gate oxide film of a MOS transistor normally used in a DRAM). With this arrangement, the conductances of two MOS transistors 21 and 22 can be increased by reducing the thickness of the gate oxide film, so that the charge/discharge time of word line WL can be shortened. Therefore, the speed of the entire DRAM can be increased.

For example, assume that the voltage applied to the gate oxide film is relaxed by about 13% from 4.5V of the negative voltage driven word line scheme to 3.9V. In this case, the gate oxide film can be thinned by 13% provided that the field strength in the gate oxide film is not changed, and the conductance of the MOS transistor can be increased by 13%.

In a CMOS inverter, as is generally known, unless when the input signal is at high level, the difference between the source voltage of the P channel MOS transistor and the high-level voltage of the input signal is sufficiently smaller than the absolute value of the threshold voltage of the P channel MOS transistor (the threshold voltage of a P channel MOS transistor has a negative value), and when the input signal is at low level, the difference between the source voltage of the N channel MOS transistor and the low-level voltage of the input signal is sufficiently smaller than the value of the threshold voltage of the N channel MOS transistor, the P and N channel MOS transistors cannot be sufficiently set in the OFF state, although they should be in the OFF state, and a tunneling current flows across the power supply voltages to increase the current consumption.

In word line driver 16 shown in FIG. 2, however, the circuit threshold voltage of CMOS inverter 23 is set to be higher than that of other CMOS inverters which operate with voltages VDD and VSS as power supply voltages.

By this higher circuit threshold voltage, CMOS inverter 23 in word line driver 16 of FIG. 2 can ideally achieve the non-conductive state during the level change of the input signal, resulting in sufficiently reducing the period of time during which said tunneling current flows.

Figure 5:
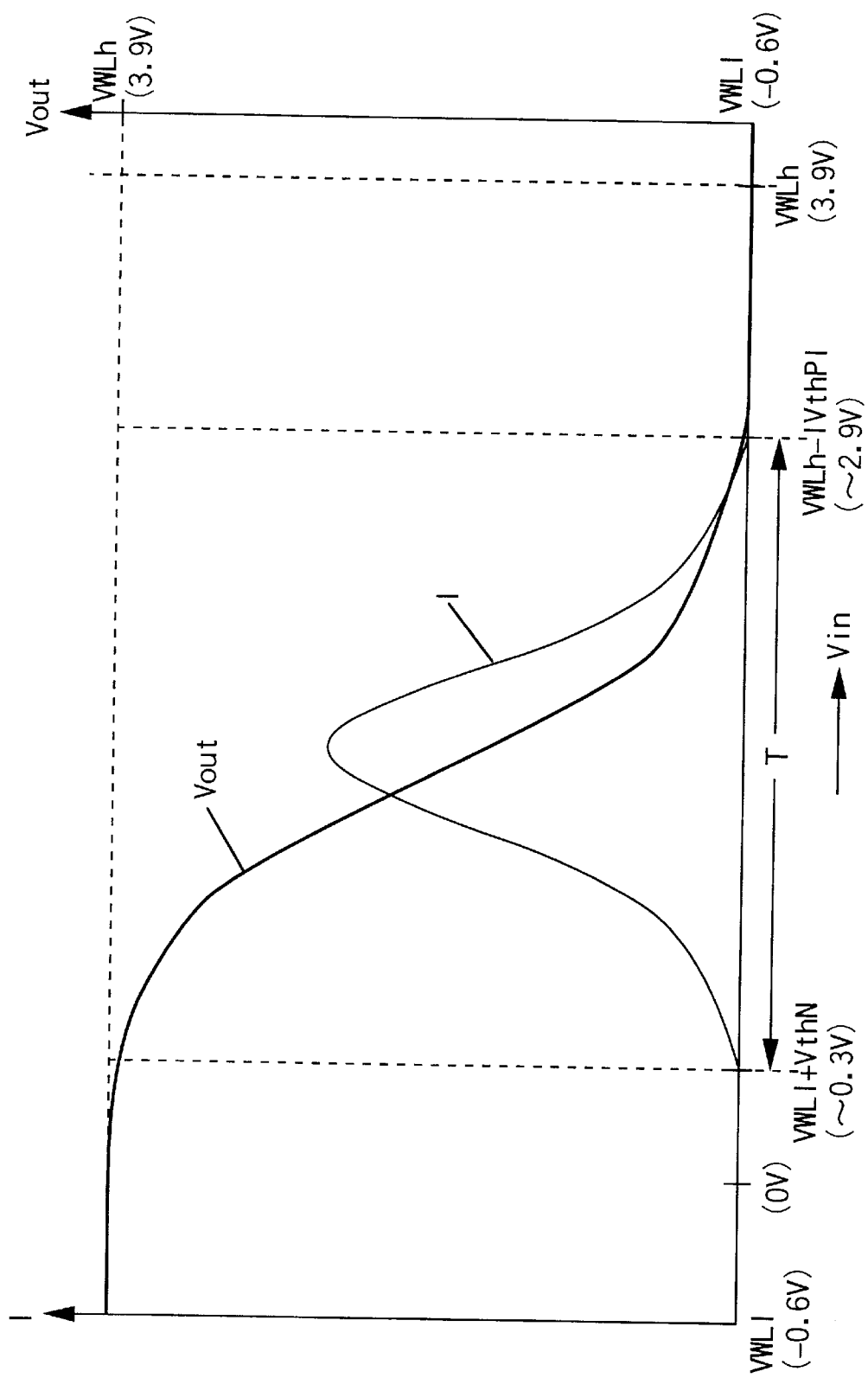
FIG. 5 shows examples of the input voltage/output voltage characteristic (Vin vs. Vout) and the current consumption characteristic I, each of which characteristic varies with the change in the output level of CMOS inverter 23 in word line driver 16 of FIG. 2.

FIG. 5 shows the input/output voltage characteristic and current consumption characteristic of CMOS inverter 23 in driver 16. In FIG. 5, Vin and Vout represent input and output voltages of CMOS inverter 23, respectively; and I, a power supply current consumption caused by said tunneling current.

In the embodiment of FIG. 2, both the absolute value (VthP (of the threshold voltage of P channel MOS transistor 21 in CMOS inverter 23 and the value of threshold voltage VthN of N channel MOS transistor 22 are set to be large to raise the circuit threshold voltage of CMOS inverter 23.

When the threshold voltages (or absolute values of the threshold voltages) of two MOS transistors 21 and 22 are set to be high to raise the circuit threshold voltage of CMOS inverter 23, period T in which current consumption I is generated due to the through current can be shortened in FIG. 5. With this arrangement, the current consumption caused by charging/discharging of word line WL can be decreased as compared to a case wherein a CMOS inverter having a normal circuit threshold voltage is used as word line driver 16.

To raise the circuit threshold voltage of CMOS inverter 23, the threshold voltages or the absolute values of the threshold voltages of P and N channel MOS transistors 21 and 22 in CMOS inverter 23 may be increased, or only one of them may be increased. The following methods can be used to raise the threshold voltages or the absolute values of the threshold voltages of the respective MOS transistors. Any one of these methods may be used, or some methods may be appropriately combined.

(1) The impurity concentration of the main dopant in the channel regions of MOS transistors 21 and 22 is set to be higher than that in the channel regions of P and N channel MOS transistors constituting another CMOS inverter (150 in the example of FIG. 2) or CMOS buffer (17 in the example of FIG. 12) which operates with voltages VDD and VSS as power supply voltages.

More specifically, assume that the impurity to be doped into the channel region of an N channel MOS transistor includes a major N type impurity material (such as phosphorus) and a minor P type impurity material (such as boron). In this case, the substantial concentration of the impurities (corresponding to the difference between the N type impurity concentration and the P type impurity concentration) should be considered. Thus, the substantial impurity concentration of the channel regions of MOS transistors 21 and 22 is set to be higher than that of the corresponding channel regions of P and N type MOS transistors (e.g., 151, 152) of other CMOS buffer or CMOS inverter (e.g., 150).

Normally, the impurity concentration in the channel region of the MOS transistor used in the DRAM is on the order of 10 exp 16 (cm−3). In a MOS transistor whose gate oxide film has a thickness of, e.g., 10 nm, when the impurity concentration in the channel region is increased by one order of magnitude, the threshold voltage rises by about 0.5 to 1V. With this method, both the threshold voltages of the P and N channel MOS transistors can be changed.

(2) Normally, polysilicon containing an N type impurity is used as the gate material of an N channel MOS transistor. Instead, (in order to increase the threshold value,) polysilicon containing a P type impurity is used as the gate material of N channel MOS transistor 22.

For example, when an N channel MOS transistor whose gate oxide film has a thickness of 10 nm uses, as a gate material, polysilicon containing a P type impurity instead of an N type impurity, the threshold voltage rises by about 0.5V. This method is used only to increase the threshold voltage of the N channel MOS transistor.

(3) The values of bias voltages supplied to the backgates of MOS transistors 21 and 22 are replaced with those of bias voltages supplied to the backgates of MOS transistors constituting a CMOS inverter which operates using voltages VDD and VSS as power supply voltages.

More specifically, the bias voltage supplied to the backgate of P channel MOS transistor 21 is set to be higher than that supplied to the backgate of a P channel MOS transistor constituting the CMOS inverter which operates using voltages VDD and VSS as power supply voltages, and the bias voltage supplied to the backgate of N channel MOS transistor 22 is set to be lower than that supplied to the backgate of a N channel MOS transistor constituting the CMOS inverter which operates using voltages VDD and VSS as power supply voltages, thereby raising the threshold voltages of MOS transistors 21 and 22.

With this method, only one of the bias voltage values of P and N channel MOS transistors can be modified to change the threshold voltage of one of the P and N channel MOS transistors.

Figure 6:
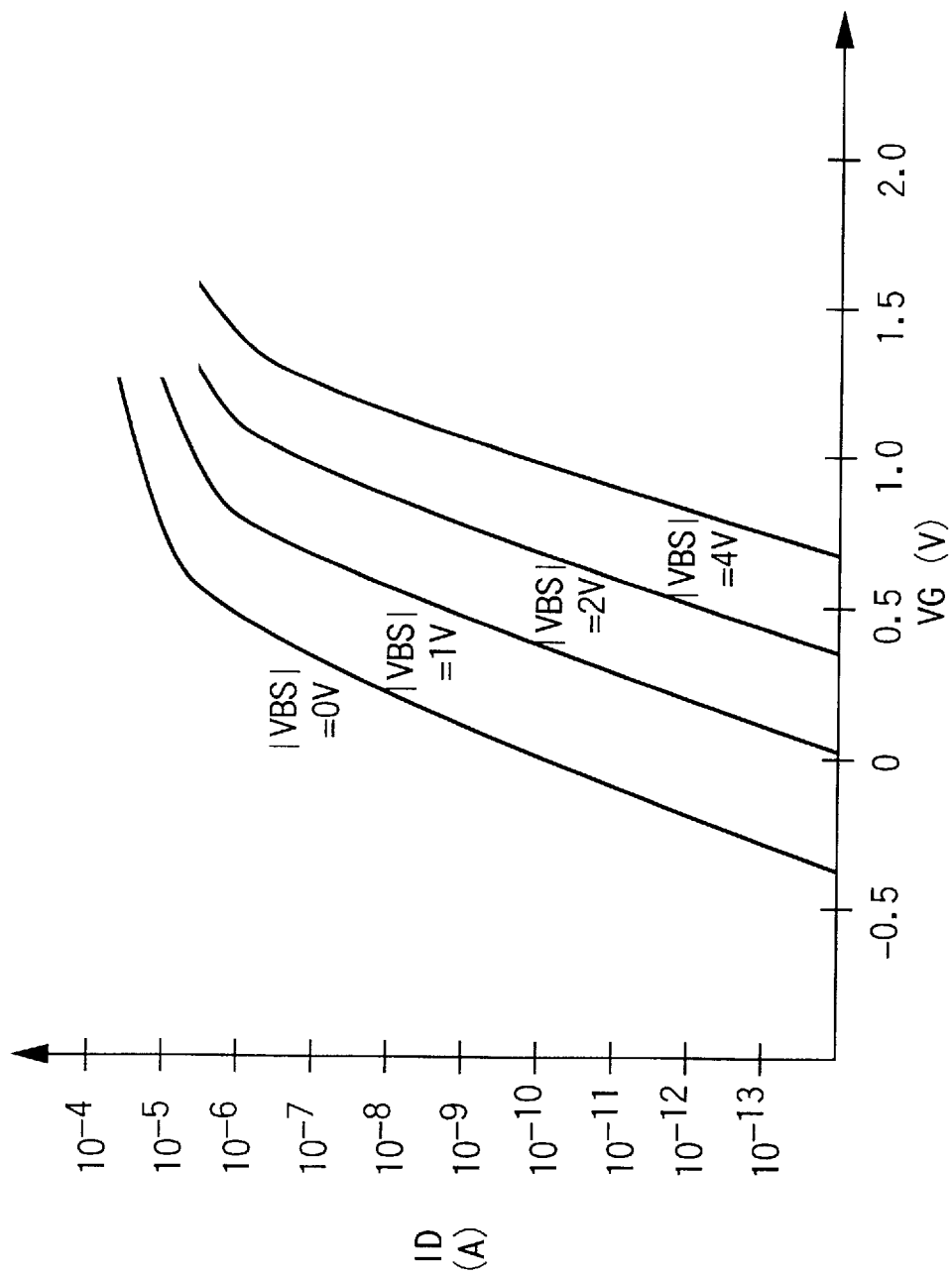
FIG. 6 shows examples of the relationship between gate voltage VG (V) and drain current ID (A) of a MOS transistor.

FIG. 6 is a graph showing the relationship between gate voltage VG and drain current ID using, as a parameter, substrate bias voltage VBS applied to the backgate of a MOS transistor whose gate oxide film has thickness of, e.g., 53 nm. In FIG. 6, gate voltage VG observed when the smallest drain current ID flows corresponds to the threshold voltage.

For example, when the absolute value |VBS| of substrate bias voltage VBS is raised from 0V to 1V, gate voltage VG increases by about 0.5V. Since the thickness of the gate oxide film of the MOS transistor used in the DRAM is normally about 10 nm, the amount of change in the threshold voltage with respect to the backgate bias voltage is approximately ⅕ that shown in FIG. 6, i.e., about 0.1V.

Figure 7:
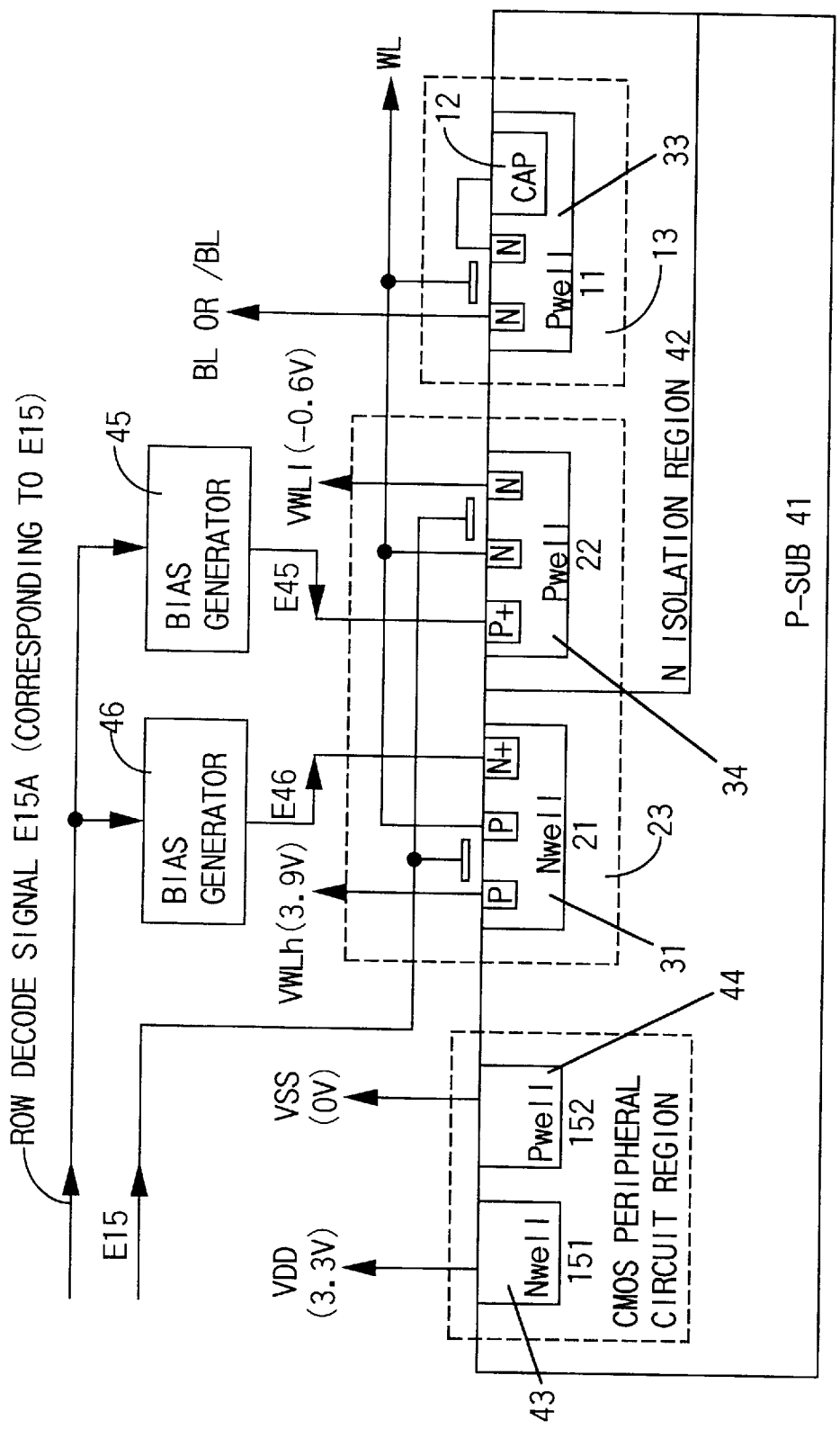
FIG. 7 is a sectional view showing the device structure of a semiconductor memory device containing a word line driver according to the second embodiment of the present invention.

The second embodiment of the present invention will be described next. FIG. 7 is a sectional view showing the device structure of a semiconductor memory device according to the second embodiment.

In this embodiment, P type substrate 41 is used as a semiconductor substrate. N type isolation region 42 is formed in substrate 41. P type well region 33 where the source and drain of an N channel MOS transistor for a transfer gate in a memory cell are formed, as shown in FIG. 3, and P type well region 34 where the source and drain of N channel MOS transistor 22 in word line driver 16 are formed, as shown in FIG. 3, are separately formed in N type isolation region 42.

In P type well region 33, the source and drain of N channel MOS transistor 11 for the transfer gate of memory cell 13 are formed. In P type well region 34, the source and drain of N channel MOS transistor 22 in word line driver 16 are formed.

N type well region 43, P type well region 44, and N type well region 31 of FIG. 3 are separately formed in substrate 41. In N type well region 31, the source and drain of P channel MOS transistor 21 of word line driver 16 are formed. In N type well region 43 and P type well region 44, peripheral circuits including CMOS inverter (or buffer) other than CMOS inverter 23 of word line driver 16 are formed.

More specifically, the source and drain of a P channel MOS transistor constituting the peripheral circuit excluding cell array 10 and word line driver 16 are formed in N type well region 43.

Further, formed in P type well region 44 are the source and drain etc., of an N channel MOS transistor which constitutes a CMOS inverter (another CMOS inverter or CMOS buffer) of the peripheral circuit, together with a P channel MOS transistor having the source and drain formed in N type well region 43.

A voltage having the smallest value of the power supply voltages for the internal logic circuit, i.e., Vss (0V) is applied to P type well region 33 as a substrate bias voltage.

A voltage having the largest value of the power supply voltages for the internal logic circuit, which are applied to the peripheral circuits excluding cell array 10 and word line driver 16, i.e., VDD (3.3V), is applied to N type well region 43 as a substrate bias voltage.

Voltage Vss (0V) is applied to P type well region 44 as a substrate bias voltage, as in P type well region 33.

Substrate bias voltage E45 supplied to P type well region 34 is generated by bias voltage generation circuit 45, and substrate bias voltage E46 supplied to N type well region 31 is generated by bias voltage generation circuit 46.

Bias voltage generation circuits 45 and 46 receive the same row decode signal E15 as that input to word line driver 16, or receive signal E15A which varies in correspondence with this row decode signal E15.

When word line driver 16 operates in accordance with decode signal E15 or E15A, bias voltage generation circuits 45 and 46 generate bias voltages E45 and E46, such that the threshold voltages of N channel MOS transistor 22 having a source and drain formed in P type well region 34 and P channel MOS transistor 21 having a source and drain formed in N type well region 31 become high (or, such that the circuit threshold voltage of CMOS inverter 23 constituted by two MOS transistors 22 and 21 rises).

More specifically, bias voltage generation circuit 45 generates a voltage of, e.g., −1.5V, i.e., a voltage lower than substrate bias voltage Vss supplied to P type well region 33. Bias voltage generation circuit 46 generates a voltage of, e.g., 4.5V, i.e., a voltage higher than substrate bias voltage VDD and VWLh supplied to N type well region 43.

FIGS. 9A–9D show an example of timing charts for explaining how bias voltage generators 45 and 46 of FIG. 7 generate respective bias voltages E45 and E46.

When bias voltage generators 45 and 46 for generating bias voltages E45 and E46 as shown in FIGS. 9A–9D are used for controlling the substrate bias of CMOS inverter 23 in word line driver 16, the circuit threshold voltage of word line driver 16 at the time of driving the word line WL can be increase so that the current consumption thereof is reduced.

Figure 8:
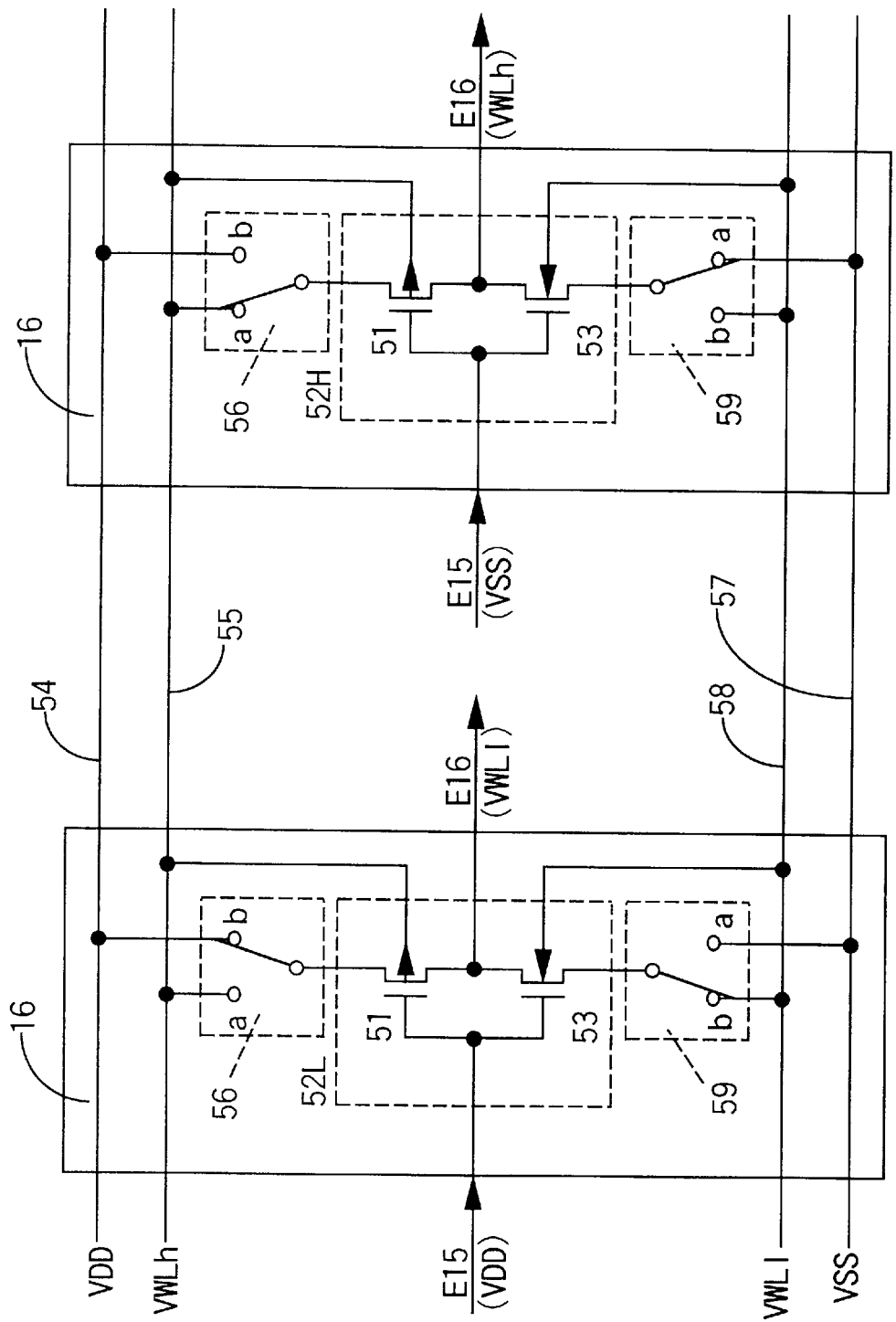
FIG. 8 is a circuit diagram showing the arrangement of word line drivers (52L, 52H) according to the third embodiment of the present invention.

The third embodiment of the present invention will be described next. FIG. 8 is a circuit diagram showing another arrangement of driver circuit (word line driver) 16 for driving the word line in a semiconductor memory device according to this embodiment. Only two word line drivers 16 are illustrated in FIG. 8, although an actual product of the embodiment will use a large number of word line drivers 16.

Each word line driver 16 comprises P channel MOS transistor 51 whose backgate is separated from the source, N channel MOS transistor 53 whose backgate is separated from the source, interconnection 54 for transferring power supply voltage VDD, interconnection 55 for transferring power supply voltage VWLh, switching circuit 56 connected to the source of P channel MOS transistor 51, interconnection 57 for transferring circuit ground voltage VSS, interconnection 58 for transferring power supply voltage VWLl, and switching circuit 59 connected to the source of N channel MOS transistor 53.

P channel MOS transistor 51 and N channel MOS transistor 53 constitutes CMOS inverter 52 (52L or 52H), and the source potentials of these transistors are on/off controlled by switching circuit 56 and 59.

Switching circuit 56 is on/off controlled with timings as shown in FIGS. 10A–10D, so that either one of voltage VDD on interconnection 54 and voltage VWLh on interconnection 55 is selectively applied to the source of P channel MOS transistor 51.

Switching circuit 59 is on/off controlled with timings as shown in FIGS. 10A–10D, so that either one of voltage VSS on interconnection 57 and voltage VWLl on interconnection 58 is selectively applied to the source of N channel MOS transistor 53.

In the circuit arrangement of FIG. 8, changing of the source potential of MOS transistor 51 (or 53) while fixing the backgate potential thereof is equivalent to changing of the backgate potential when viewed from the source thereof.

More specifically, in the circuit arrangement of FIG. 7, the threshold value of the MOS transistor is changed by switching the backgate bias while fixing the source potential thereof. On the other hand, in the circuit arrangement of FIG. 8, the threshold value of the MOS transistor is changed by switching the source potential while fixing the backgate bias thereof. In view of the fact that the threshold voltage (Vth) between the source and gate of a MOS transistor varies with the backgate bias potential when the source thereof is used as the reference of potential (cf. FIG. 6), the circuit arrangement of FIG. 8 may have the same function (switching of the threshold value) as that of FIG. 7.

In other words, according to the embodiment of FIG. 7, the backgate bias is changed in order to vary the gate threshold voltage of the MOS transistor and, according to the embodiment of FIG. 8, the source potential is changed to vary the gate threshold voltage. With the variation in the gate threshold voltage(s) of the MOS transistor(s), the circuit threshold value of an inverter or buffer constituted by these MOS transistors is also changed.

Note that the source potential of the MOS transistor(s) of FIG. 7 is fixed while the source potential of FIG. 8 is not fixed. For this reason, it is possible to make the degree of change in the circuit threshold value of FIG. 8 larger than that in the circuit threshold value of FIG. 7.

The backgate of P channel MOS transistor 51 in CMOS inverters 52L and 52H is connected to interconnection 55 for transferring power supply voltage VWLh, and the backgate of N channel MOS transistor 53 therein is connected to interconnection 58 for transferring power supply voltage VWLl.

Switching circuits 56 and 59 receive the same decode signal E15 (or another signal whose level varies in response to E15) as that input to each word line driver 52. Switching circuits 56 and 59 select power supply voltages in accordance with the decode signal (E15 or the corresponding signal) and supply the selected voltages to the sources of corresponding MOS transistors.

With this arrangement, in CMOS inverter 52L of word line driver 16 for receiving high-level voltage VDD as decode signal E15, one switching circuit 56 selects (via contact b) power supply voltage VDD on interconnection 54 in response to decode signal E15 and supplies the selected voltage to the source of P channel MOS transistor 51. The other switching circuit 59 selects (via contact b) power supply voltage VWLl on interconnection 58 in response to decode signal E15 and supplies the selected voltage to the source of N channel MOS transistor 53.

In CMOS inverter 52L which receives the high-level voltage VDD as decode signal E15, N channel MOS transistor 53 is turned on, and a low-level voltage, i.e., VWLl is output as word line drive signal E16 to corresponding word line WL.

For P channel MOS transistor 51 which should be in the OFF state, voltage VDD lower than voltage VWLh supplied to the backgate is applied to the source through switching circuit 56. For this reason, in P channel MOS transistor 51, the backgate bias voltage (substrate bias voltage) becomes higher than the source voltage, and the threshold voltage rises. Therefore, the circuit threshold voltage of CMOS inverter 52L rises, and period T during which said tunneling current flows can be shortened.

On the other hand, in CMOS inverter 52H for receiving low-level voltage VSS as decode signal E15, one switching circuit 56 selects (via contact a) power supply voltage VWLh on interconnection 55 in response to decode signal E15 and supplies the selected voltage to the source of P channel MOS transistor 51. The other switching circuit 59 selects (via contact a) power supply voltage VSS on interconnection 57 in response to decode signal E15 and supplies the selected voltage to the source of N channel MOS transistor 53.

In CMOS inverter 52H which receives the low-level voltage VSS as decode signal E15, P channel MOS transistor 51 is turned on, and a high-level voltage, i.e., VWLh is output as word line drive signal E16 to corresponding word line WL.

For N channel MOS transistor 53 which should be in the OFF state, voltage VSS higher than voltage VWLl supplied to the backgate is applied to the source through switching circuit 59. For this reason, in N channel MOS transistor 53, the backgate bias voltage (substrate bias voltage) becomes lower than the source voltage, and the threshold voltage rises. Therefore, the circuit threshold voltage of CMOS inverter 52H rises, and period T during which said tunneling current flows can be shortened.

Figure 12:
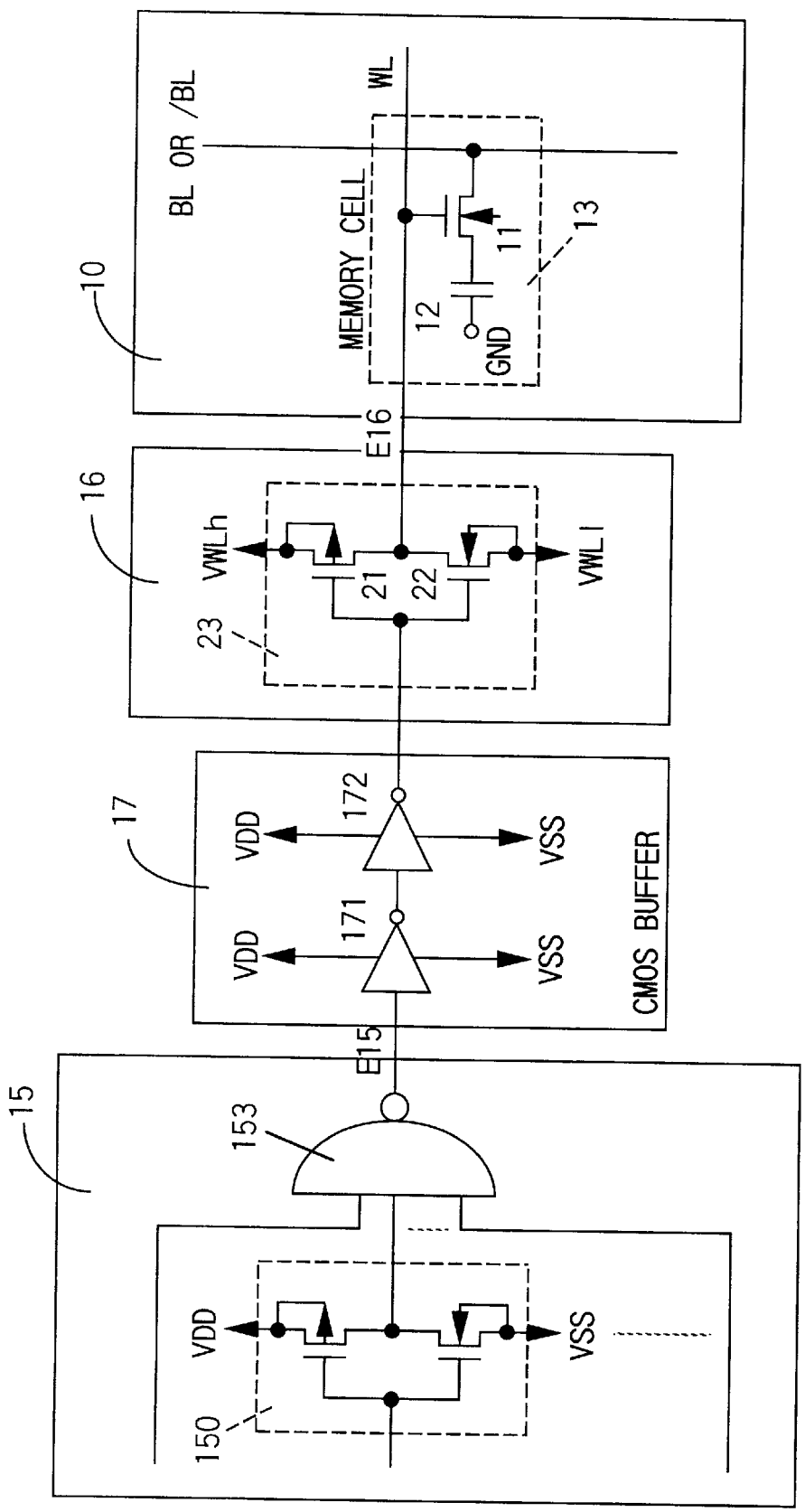
FIG. 12 is a circuit arrangement for explaining a semiconductor memory device containing a word line driver according to the fourth embodiment of the present invention.

FIG. 12 is a circuit arrangement for explaining a semiconductor memory device containing a word line driver according to the fourth embodiment of the present invention.

In the circuit arrangement of FIG. 12, CMOS buffer 17 formed of a series circuit of CMOS inverters 171 and 172 is inserted between row decoder 15 and word line driver 16 shown in FIG. 2.

Each of CMOS inverters 171 and 172 can be constituted by P channel MOS transistor (151) and N channel MOS transistor (152) similar to CMOS inverter 150 of FIG. 2.

When the output stage CMOS inverter 172 of CMOS buffer 17 is designed to operate with the power supply of VDD and VSS (e.g., 3.3V and 0V), CMOS inverter 23 of word line driver 16 is designed to operate with the power supply of VWLh and VWLl (e.g., 3.9V and –0.6V).

With this circuit arrangement, the circuit of FIG. 12 may have the same advantages (improvement in the gate withstanding voltage of MOS transistors in word line driver 16, and minimizing the necessary number of MOS transistors) as that of FIG. 2.

As has been described above, according to the present invention, the gate oxide film of MOS transistors constituting word line driver 16 becomes strong in comparison with the prior art (improvement in the withstanding voltage of the gate). Then, (since no additional countermeasure for improving the withstanding voltage of the gate oxide film is required), the number of transistors constituting word line driver 16 can be effectively reduced when it is formed in an IC chip. This will facilitate the layout of word line driver 16 according to the decoder pitch, and reduce the manufacturing cost of the IC.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

I claim:

1. A signal driver circuit comprising:
   a semiconductor circuit element including a signal line;
   a first MOS transistor of a P channel type including a gate which receives an input signal having an amplitude defined between a first voltage and a second voltage smaller than the first voltage, one electrode connected to a node with a third voltage which is higher in potential than the first voltage, and other electrode forming a first current path with respect to the one electrode thereof and connected to said signal line;

a second MOS transistor of an N channel type including a gate which receives said input signal, one electrode connected to another node with a fourth voltage which is lower in potential than the second voltage, and other electrode forming a second path with respect to the one electrode thereof and connected to said signal line;

a CMOS inverter constituted by said first and second MOS transistors and operating with a power supply of said third voltage and said fourth voltage, said CMOS inverter having its circuit threshold value; and another CMOS inverter or a CMOS buffer operating with another power supply of said first voltage and said second voltage, said another CMOS inverter or said CMOS buffer having its circuit threshold value, wherein the circuit threshold value of said CMOS inverter, which operates with said third voltage and said fourth voltage, is selected to be larger than that of said another CMOS inverter or said CMOS buffer which operates with said first voltage and said second voltage.

2. The circuit of claim 1, wherein said first and second MOS transistors constituting said CMOS inverter have their own threshold voltages, and at least one of these threshold voltages of said first and second MOS transistors is selected to be larger than a threshold voltage of any of MOS transistors constituting said another CMOS inverter or said CMOS buffer.

3. The circuit of claim 1, wherein said first and second MOS transistors constituting said CMOS inverter and MOS transistors constituting said another CMOS inverter or said CMOS buffer are formed in respective channel regions of a semiconductor device, wherein the channel regions of the MOS transistors of said CMOS inverter and of said another CMOS inverter or said CMOS buffer are formed with given impurity concentrations of main dopants whose conductivity types include either one of P and N types, and wherein at least one impurity concentration of the one type of said first and second MOS transistors is selected to be larger than the impurity concentration of the corresponding type of said another CMOS inverter or said CMOS buffer, so that the circuit threshold value of said CMOS inverter is to be larger than that of said another CMOS inverter or said CMOS buffer.

4. The circuit of claim 1, wherein the gate of the N channel type second MOS transistor constituting said CMOS inverter is formed of a P type polysilicon, and wherein said another CMOS inverter or said CMOS buffer includes an N channel type MOS transistor having a gate formed of an N type polysilicon.

5. The circuit of claim 1, wherein said another CMOS inverter or said CMOS buffer includes a P channel type MOS transistor in correspondence with said first MOS transistor and an N channel type MOS transistor in correspondence with said second MOS transistor, wherein the first and second MOS transistors of said CMOS inverter have their own backgate biases, and wherein the MOS transistors of said another CMOS inverter or said CMOS buffer have their own backgate biases, said circuit further comprising:

means for changing the backgate bias of at least one of the first and second MOS transistors of said CMOS inverter from the backgate bias of the corresponding MOS transistor of said another CMOS inverter or said CMOS buffer, the type of said corresponding MOS transistor being the same as that of said at least one of the first and second MOS transistors.

6. The circuit of claim 1, wherein said another CMOS inverter or said CMOS buffer includes a P channel type MOS transistor in correspondence with said first MOS transistor and an N channel type MOS transistor in correspondence with said second MOS transistor, wherein the first and second MOS transistors of said CMOS inverter have their own backgate biases, and wherein the MOS transistors of said another CMOS inverter or said CMOS buffer have their own backgate biases, said circuit further comprising:

first backgate bias means for setting the backgate bias of the P channel type MOS transistor of said CMOS inverter higher than the backgate bias of the P channel type MOS transistor of said another CMOS inverter or said CMOS buffer; and second backgate bias means for setting the backgate bias of the N channel type MOS transistor of said CMOS inverter lower than the backgate bias of the N channel type MOS transistor of said another CMOS inverter or said CMOS buffer.

7. A semiconductor memory having a plurality of bit lines, a plurality of word lines, and memory cells arranged at respective cross points of the bit lines and word lines, said memory comprising:

a first MOS transistor of a P channel type including a gate which receives an input signal having an amplitude defined between a first voltage and a second voltage smaller than the first voltage, one electrode connected to a node with a third voltage which is higher in potential than the first voltage, and other electrode forming a first current path with respect to the one electrode thereof and connected to said word line;

a second MOS transistor of an N channel type including a gate which receives said input signal, one electrode connected to another node with a fourth voltage which is lower in potential than the second voltage, and other electrode forming a second path with respect to the one electrode thereof and connected to said word line;

a first CMOS inverter constituted by said first and second MOS transistors and operating with a power supply of said third voltage and said fourth voltage, said first CMOS inverter having its circuit threshold value; and an address decoder including a second CMOS inverter operating with another power supply of said first voltage and said second voltage, said second CMOS inverter having its circuit threshold value, wherein the circuit threshold value of said first CMOS inverter, which operates with said third voltage and said fourth voltage, is selected to be larger than that of said second CMOS inverter which operates with said first voltage and said second voltage.

8. The circuit of claim 7, wherein said first and second MOS transistors constituting said first CMOS inverter have their own threshold voltages, and at least one of these threshold voltages of said first and second MOS transistors is selected to be larger than a threshold voltage of any of MOS transistors constituting said second CMOS inverter, so that the circuit threshold value of said first CMOS inverter is to be larger than that of said second CMOS inverter.

9. The circuit of claim 7, wherein said first and second MOS transistors constituting said first CMOS inverter and MOS transistors constituting said second CMOS inverter are formed in respective channel regions of a semiconductor device, wherein the channel regions of the MOS transistors of said first CMOS inverter and of said second CMOS inverter are formed with given impurity concentrations of main dopants whose conductivity types include either one of P and N types, and wherein at least one impurity concentration of the one type of said first and second MOS transistors is selected to be larger than the impurity concentration of the corresponding type of said second CMOS inverter, so that the circuit threshold value of said first CMOS inverter is to be larger than that of said second CMOS inverter.

10. The circuit of claim 7, wherein the gate of the N channel type second MOS transistor constituting said first CMOS inverter is formed of a P type polysilicon, and wherein said second CMOS inverter includes an N channel type MOS transistor having a gate formed of an N type polysilicon, so that the circuit threshold value of said first CMOS inverter is to be larger than that of said second CMOS inverter.

11. The circuit of claim 7, wherein said second CMOS inverter includes a P channel type MOS transistor in correspondence with said first MOS transistor and an N channel type MOS transistor in correspondence with said second MOS transistor, wherein the first and second MOS transistors of said first CMOS inverter have their own backgate biases, and wherein the MOS transistors of said second CMOS inverter have their own backgate biases, said circuit further comprising:

means for changing the backgate bias of at least one of the first and second MOS transistors of said first CMOS inverter from the backgate bias of the corresponding MOS transistor of said second CMOS inverter, the type of said corresponding MOS transistor being the same as that of said at least one of the first and second MOS transistors.

12. The circuit of claim 7, wherein said second CMOS inverter includes a P channel type MOS transistor in correspondence with said first MOS transistor and an N channel type MOS transistor in correspondence with said second MOS transistor, wherein the first and second MOS transistors of said first CMOS inverter have their own backgate biases, and wherein the MOS transistors of said second CMOS inverter have their own backgate biases, said circuit further comprising:

first backgate bias means for setting the backgate bias of the P channel type MOS transistor of said first CMOS inverter higher than the backgate bias of the P channel type MOS transistor of said second CMOS inverter; and second backgate bias means for setting the backgate bias of the N channel type MOS transistor of said first CMOS inverter lower than the backgate bias of the N channel type MOS transistor of said second CMOS inverter.

13. A semiconductor memory having a plurality of bit lines, a plurality of word lines, and memory cells arranged at respective cross points of the bit lines and word lines, said memory comprising:

a first MOS transistor of a P channel type including a gate which receives an input signal having an amplitude defined between a first voltage and a second voltage smaller than the first voltage, one electrode connected to a node with a third voltage which is higher in potential than the first voltage, and other electrode forming a first current path with respect to the one electrode thereof and connected to said word line;

a second MOS transistor of an N channel type including a gate which receives said input signal, one electrode connected to another node with a fourth voltage which is lower in potential than the second voltage, and other electrode forming a second path with respect to the one electrode thereof and connected to said word line;

a CMOS inverter constituted by said first and second MOS transistors and operating with a power supply of said third voltage and said fourth voltage, said CMOS inverter having its circuit threshold value; and a CMOS buffer operating with another power supply of said first voltage and said second voltage, said CMOS buffer having its circuit threshold value, wherein the circuit threshold value of said CMOS inverter, which operates with said third voltage and said fourth voltage, is selected to be larger than that of said CMOS buffer which operates with said first voltage and said second voltage.

14. The circuit of claim 13, wherein said first and second MOS transistors constituting said CMOS inverter have their own threshold voltages, and at least one of these threshold voltages of said first and second MOS transistors is selected to be larger than a threshold voltage of any of MOS transistors constituting said CMOS buffer, so that the circuit threshold value of said CMOS inverter is to be larger than that of said CMOS buffer.

15. The circuit of claim 13, wherein said first and second MOS transistors constituting said CMOS inverter and MOS transistors constituting said CMOS buffer are formed in respective channel regions of a semiconductor device, wherein the channel regions of the MOS transistors of said CMOS inverter and of said CMOS buffer are formed with given impurity concentrations of main dopants whose conductivity types include either one of P and N types, and wherein at least one impurity concentration of the one type of said first and second MOS transistors is selected to be larger than the impurity concentration of the corresponding type of said CMOS buffer, so that the circuit threshold value of said CMOS inverter is to be larger than that of said CMOS buffer.

16. The circuit of claim 13, wherein the gate of the N channel type second MOS transistor constituting said CMOS inverter is formed of a P type polysilicon, and wherein said CMOS buffer includes an N channel type MOS transistor having a gate formed of an N type polysilicon, so that the circuit threshold value of said CMOS inverter is to be larger than that of said CMOS buffer.

17. The circuit of claim 13, wherein said CMOS buffer includes a P channel type MOS transistor in correspondence with said first MOS transistor and an N channel type MOS transistor in correspondence with said second MOS transistor, wherein the first and second MOS transistors of said CMOS inverter have their own backgate biases, and wherein the MOS transistors of said CMOS buffer have their own backgate biases, said circuit further comprising:

means for changing the backgate bias of at least one of the first and second MOS transistors of said CMOS inverter from the backgate bias of the corresponding MOS transistor of said CMOS buffer, the type of said corresponding MOS transistor being the same as that of said at least one of the first and second MOS transistors.

18. The circuit of claim 13, wherein said CMOS buffer includes a P channel type MOS transistor in correspondence with said first MOS transistor and an N channel type MOS transistor in correspondence with said second MOS transistor, wherein the first and second MOS transistors of said CMOS inverter have their own backgate biases, and wherein the MOS transistors of said CMOS buffer have their own backgate biases, said circuit further comprising:

first backgate bias means for setting the backgate bias of the P channel type MOS transistor of said CMOS inverter higher than the backgate bias of the P channel type MOS transistor of said CMOS buffer; and second backgate bias means for setting the backgate bias of the N channel type MOS transistor of said CMOS inverter lower than the backgate bias of the N channel type MOS transistor of said CMOS buffer.

19. A semiconductor device comprising:

a semiconductor substrate of a first conductivity type;

a first well region of a second conductivity type, a second well region of the second conductivity type, and a third well region of the first conductivity type, said first, second and third well regions being separately formed in said semiconductor substrate;

an isolation region of the second conductivity type formed in said semiconductor substrate;

a fourth well region of the first conductivity type formed in said isolation region;

a decoder circuit for decoding an address signal to provide an output signal having an amplitude between a first voltage and a second voltage which is smaller than the first voltage;

a first MOS transistor of the first conductivity type formed in said first well region;

a second MOS transistor of the second conductivity type formed in said third well region, said first and second MOS transistors constituting a first CMOS inverter having a circuit threshold value;

a third MOS transistor of the first conductivity type formed in said second well region, and having a gate responsive to said output signal, a source, and a drain, wherein the source and drain of said third MOS transistor form a current path having one end connected to a node for supplying a third voltage which is larger than said first voltage, and having the other end connected to a given signal line;

a fourth MOS transistor of the second conductivity type formed in said fourth well region, and having a gate responsive to said output signal, a source, and a drain, wherein the source and drain of said fourth MOS transistor form another current path having one end connected to another node for supplying a fourth voltage which is smaller than said second voltage, and having the other end connected to said given signal line, said third and fourth MOS transistors constituting a second CMOS inverter having another circuit threshold value;

a first bias voltage generator circuit for generating a first bias voltage which is supplied to said second well region; and a second bias voltage generator circuit for generating a second bias voltage which is supplied to said fourth well region, wherein the first and second bias voltages are generated by said first and second bias voltage generator circuits, such that the circuit threshold value of said second CMOS inverter is larger than that of said first CMOS inverter.

20. The device of claim 19, wherein said first and third voltages are positive in potential with respect to said second voltage serving as a potential reference, and said fourth voltage is negative in potential with respect to said second voltage.

21. The device of claim 19, wherein said first and second bias voltage generator circuits respectively generate said first and second bias voltages in response to said address signal.

22. The device of claim 19, wherein a plurality of bit lines, a plurality of word lines, and a plurality of memory cells arranged at respective cross points of the bit lines and word lines are formed in said semiconductor substrate, and said given signal line is connected to a corresponding one of said word lines.

23. A word line driver circuit comprising:

a first power line for supplying a first voltage;

a second power line for supplying a second voltage which is larger than said first voltage;

a third power line for supplying a third voltage which is smaller than said first voltage;

a fourth power line for supplying a fourth voltage which is smaller than said third voltage;

a first MOS transistor of a P channel type having a gate, a source, a drain, and a backgate, wherein the gate of said first MOS transistor receives an input signal having an amplitude between said first voltage and said second voltage and corresponding to an address signal, the drain thereof is connected to a word line, and the backgate thereof is connected to said second power line;

a second MOS transistor of an N channel type having a gate, a source, a drain, and a backgate, wherein the gate of said second MOS transistor receives said input signal, the drain thereof is connected to said word line, and the backgate thereof is connected to said fourth power line;

a first switch circuit, responsive to said address signal, for selectively connecting either one of said first and second power lines to the source of said first MOS transistor; and a second switch circuit, responsive to said address signal, for selectively connecting either one of said third and fourth power lines to the source of said second MOS transistor.

24. The circuit of claim 23, wherein said first and second voltages are positive in potential with respect to said third voltage serving as a potential reference, and said fourth voltage is negative in potential with respect to said third voltage.

25. A semiconductor memory device comprising:

a decoder circuit for decoding an address signal to provide a decode signal having an amplitude between a first voltage and a second voltage which is smaller than the first voltage, said decoder circuit including a decoder side CMOS inverter or a decoder side CMOS buffer operated with a power supply of said first and second voltages, wherein said decoder side CMOS inverter or said decoder side CMOS buffer has a circuit threshold value;

a word line driver circuit including a driver side CMOS inverter which is constituted by a first MOS transistor of a P channel type having a gate responsive to said decode signal, a source, and a drain, and a second MOS transistor of an N channel type having a gate responsive to said decode signal, a source, and a drain, wherein the source and drain of said first MOS transistor form a current path having one end connected to a node for supplying a third voltage which is larger than said first voltage, and having the other end connected to a word line, wherein the source and drain of said second MOS transistor form another current path having one end connected to another node for supplying a fourth voltage which is smaller than said second voltage, and having the other end connected to said word line, and wherein said driver side CMOS inverter has another circuit threshold value; and a memory cell including a transfer gate and a memory capacitor selectively connected to a bit line via said transfer gate whose conduction state is controlled based on a signal level on said word line, wherein the circuit threshold value of said driver side CMOS inverter is selected to be larger than that of said decoder side CMOS inverter or said decoder side CMOS buffer.

26. The device of claim 25, wherein said first and third voltages are positive in potential with respect to said second voltage serving as a potential reference, and said fourth voltage is negative in potential with respect to said second voltage.

27. The device of claim 25, wherein the first and second MOS transistors of said driver side CMOS inverter have their threshold voltages, wherein said decoder side CMOS inverter or said decoder side CMOS buffer includes MOS transistors of P and N channel types having their threshold voltages, and wherein the threshold voltage of at least one of said first and second MOS transistors is selected to be larger than that of the corresponding channel type MOS transistor of said decoder side CMOS inverter or said decoder side CMOS buffer, so that the circuit threshold value of said driver side CMOS inverter is larger than that of said decoder side CMOS inverter or said decoder side CMOS buffer.

28. The device of claim 25, wherein the first and second MOS transistors of said driver side CMOS inverter have channel regions containing their impurity concentrations of main dopants, wherein said decoder side CMOS inverter or said decoder side CMOS buffer includes MOS transistors of P and N channel types having channel regions containing their impurity concentrations of the main dopants, and wherein the impurity concentration of at least one of said first and second MOS transistors is selected to be larger than that of the corresponding channel type MOS transistor of said decoder side CMOS inverter or said decoder side CMOS buffer, so that the circuit threshold value of said driver side CMOS inverter is larger than that of said decoder side CMOS inverter or said decoder side CMOS buffer.

29. The device of claim 25, wherein the N channel type second MOS transistor of said driver side CMOS inverter has a gate formed of a P type polysilicon, and wherein said decoder side CMOS inverter or said decoder side CMOS buffer includes an N channel type MOS transistor having a gate formed of a N type polysilicon, so that the circuit threshold value of said driver side CMOS inverter is larger than that of said decoder side CMOS inverter or said decoder side CMOS buffer.

30. The device of claim 25, wherein the first and second MOS transistors of said driver side CMOS inverter have their backgate biases, wherein said decoder side CMOS inverter or said decoder side CMOS buffer includes P and N channel type MOS transistors having their backgate biases, and wherein the backgate bias of at least one of the first and second MOS transistors of said driver side CMOS inverter differs from the backgate bias of the MOS transistor of the corresponding channel type of said decoder side CMOS inverter or said decoder side CMOS buffer, so that the circuit threshold value of said driver side CMOS inverter is larger than that of said decoder side CMOS inverter or said decoder side CMOS buffer.

31. The device of claim 25, wherein the first and second MOS transistors of said driver side CMOS inverter have their backgate biases, wherein said decoder side CMOS inverter or said decoder side CMOS buffer includes P and N channel type MOS transistors having their backgate biases, wherein the backgate bias of the P channel type first MOS transistor of said driver side CMOS inverter is larger than the backgate bias of the P channel type MOS transistor of said decoder side CMOS inverter or said decoder side CMOS buffer, and wherein the backgate bias of the N channel type first MOS transistor of said driver side CMOS inverter is smaller than the backgate bias of the N channel type MOS transistor of said decoder side CMOS inverter or said decoder side CMOS buffer, so that the circuit threshold value of said driver side CMOS inverter is larger than that of said decoder side CMOS inverter or said decoder side CMOS buffer.

* * * * *